United States Patent [19]
Magome et al.

[11] Patent Number: 5,168,468
[45] Date of Patent: Dec. 1, 1992

[54] SEMICONDUCTOR MEMORY DEVICE WITH COLUMN REDUNDANCY

[75] Inventors: Koichi Magome, Hiratsuka; Hiroshi Sahara; Haruki Toda, both of Yokohama, all of Japan

[73] Assignee: Kabushiki Kaisha Toshiba, Kawasaki, Japan

[21] Appl. No.: 789,036

[22] Filed: Nov. 7, 1991

[30] Foreign Application Priority Data

Nov. 8, 1990 [JP] Japan ................................. 2-302932

[51] Int. Cl.$^5$ ............................................. G11C 29/00
[52] U.S. Cl. ............................... 365/200; 365/189.05; 365/230.06; 371/10.3
[58] Field of Search .............. 365/200, 189.05, 230.26; 371/10.3

[56] References Cited

U.S. PATENT DOCUMENTS 5,058,069 10/1991 Gaultier et al. ...................... 365/200

Primary Examiner—Joseph E. Clawson, Jr.
Attorney, Agent, or Firm—Foley & Lardner

[57] ABSTRACT

A semiconductor memory device comprises a memory cell array, a redundant memory cell array, bit line pairs, spare bit line pairs, a column address information storage circuit having stored therein information of a column address of a faulty cell and a column address of a spare cell, column decoders, a first column selecting gate for connecting one of the bit line pairs and first data output line pairs, a second column selecting gate for connecting one of the bit line pairs and a second data output line pair, a spare column decoder for selecting a third or a fourth column selecting line, a third column selecting gate for connecting the spare bit line pairs and the first data output line pairs, a fourth column selecting gate for connecting the spare bit line pairs and the second data output line pair, a first buffer for selecting two data and amplifying and outputting, a second buffer for amplifying and outputting data from the second data output line pair, and a register for storing therein data from the first and/or second buffers.

3 Claims, 9 Drawing Sheets

|  | (1) | (2) | (3) | (4) |
|---|---|---|---|---|
|  | $n \leq 4(j-1)+2$ <br> $n \geq 4(j+1)$ | $n = 4(j-1)+3$ | $4j \leq n \leq 4j+2$ | $n = 4j+3$ |
| n | NORMAL | NORMAL | SPARE | SPARE |
| n + 1 | NORMAL | SPARE | SPARE | NORMAL |
| $\overline{CSPN}$ | HIGH LEVEL | HIGH LEVEL | LOW LEVEL | LOW LEVEL |
| $\overline{CSPT}$ | LOW / HIGH | LOW LEVEL | HIGH LEVEL | HIGH LEVEL |

FIG. 4

SEMICONDUCTOR MEMORY DEVICE WITH COLUMN REDUNDANCY

BACKGROUND OF THE INVENTION

This invention relates to a semiconductor memory device, and more particularly to a function for decoding an address of a high integrated, high speed DRAM, and is suitable for a RAM section of a dual port memory and for picture images in particular.

A dual port memory includes a randomly accessible RAM section and a serially accessible serial access memory section (hereinafter referred to as SAM section). Such a dual port memory is very useful for picture image processing of a CAD, a work station (WS) and so forth, and as improvement in speed and function of a picture image system proceeds, requests for more sophisticated functions and reductions in the access time are progressively increasing.

One of most basic ways of using a dual port memory is real time reading/transferring. In such real time reading/transferring, for example, the SAM side serially outputs the contents of a register while the RAM side writes a series of data in a page mode into a certain row, and the data of the row are transferred at a time from the RAM section to the SAM section, and then the SAM side continuously outputs the transferred data from an address received upon such transfer.

In this instance, only those data which are outputted for the first time after such transfer follow, due to a restriction in time, a different data path from that of data which are outputted for the second time et seq. Data for the second time et seq. are stored from a certain row of the RAM once into a register at the same column address and are then serially accessed and outputted by a toggle of serial clocks (SC) by which the SAM is controlled. However, only for the first time, not such data that have been transferred to such a SAM register but data stored in a separately provided 1-bit temporary register are transferred directly to an output buffer so that they may be outputted from the dual port memory.

Therefore, on the RAM side, data of a column address received upon transfer must be read out from a cell and stored into a 1-bit temporary register. The foregoing is disclosed in Nikkei Electronics, Aug. 12, 1985, Nikkei McGraw Hill.

Operation of such a dual port memory when 1-bit data are stored into the temporary register will be described first with reference to FIG. 7 in which construction of a column address decoding system and an I/0 line system is shown. Here, however, in order to facilitate description, the number of column addresses to be selected at a time by way of a single column selecting line is determined to be 2 and the column address ranges from 0 to 255. Further, while each of a bit line, a data output line I/0 and so forth is normally in the form of complementary lines and is composed of a set of two lines, it is represented by a single line in FIG. 7. Meanwhile, since a row address is at will, only a selected word line WL$_m$ and a group of memory cells connected to the word line WL$_m$ are shown in FIG. 7.

A column address signal is received from the outside, amplified by a column address buffer 70 and transferred into signal lines 700. If the column address is, for example, 3, then a column decoder CD1 which is to be selected when the column address is 2 or 3 will be selected. Thus, a column selecting line CSL1 of the column decoder CD1 is selected automatically, and consequently, a pair of column gate transistors G2 and G3 are rendered conducting so that data of 2 bits of a memory cell MC2 and another memory cell MC3 are read out into data input/output lines I/00 and I/01, respectively. Then, the 2-bit data thus read out are then decoded and amplified by an I/0 line selecting buffer 10, and in this instance, data of the data input/output line I/01, in short, data from the column address 3, are outputted into a data line 400.

In an ordinary reading operation, a gate 60 is open, and consequently, the data on the data line 400 are once transferred to an output buffer 50 by way of an n address data line pair 410 and then outputted to the outside. When the dual port memory is in a reading/transferring mode, the gate 60 is closed while another gate 65 is open, and consequently, the data on the data line 400 are transferred to and stored into a temporary register 90 by way of another n address data line pair 420. Such operation is not limited to the case wherein the column address is 3, but is similar to another case wherein the column address assumes any other value.

Also, as requests for improvement in speed in accessing to a serial output of the SAM increase, new techniques for high speed operation have been proposed. One of such techniques is a data reading technique called "SAM of the pipeline interleave system". According to such a system, accessing is commenced two cycles prior to an SC cycle in which data are to be outputted. Operation in a case wherein the pipeline interleave system is applied to such real time reading/transferring as described above will be described below with reference to FIG. 8 which shows operation waveforms of several control signals. A row address signal is read in at a falling edge of a row address strobe ($\overline{RAS}$) signal, and then a column address signal is read in at a falling edge of a column address strobe ($\overline{CAS}$) signal. Here, of a column address signal, a serial access starting address (hereinafter referred to as TAP address) of the SAM is determined to be n. Furthermore, transfer of data is performed at the time of a rising edge of a data transfer/output enable ($\overline{DT}$/e,ovs/OE/ ) signal. A serial clock (SC) signal defines a cycle when serial accessing is to be performed. Meanwhile, an address data signal and a serial I/0 signal indicate that accessing is started two SC cycles prior to an SC cycle in which serial outputting of data are to be started. In a first SC cycle immediately after the start of such transfer, data corresponding to a column address signal n must be outputted while data corresponding to another column address signal n+2 are accessed from the SAM register, but in a second SC cycle, data corresponding to a column address signal n+1 must be outputted while data corresponding to another column address signal n+3 are accessed from the SAM register.

In short, data of 2 bits corresponding to the column address signals n and n+1 must be sent out not from the SAM register but directly from the RAM side to the output buffer of the SAM side. Accordingly, the RAM side is required to have a function of reading out such two bits at a time and a 2-bit temporary register for storing such two bits therein.

Here, with the conventional arrangement shown in FIG. 7, data, for example, at the column addresses 2 and 3, can be read out at a time into the data output lines I/00 and I/01 and finally stored into the temporary register 90 in the form of a 2-bit register. However, the column addresses 3 and 4 cannot be selected at the same time, since they correspond to the two column selecting lines CSL1 and CSL2, respectively. In short, with the conventional arrangement shown in FIG. 7, data at the column addresses n and n+1 cannot be read out at the same time.

Several improved techniques have been proposed in order to remove such a drawback. Exemplary ones of such improved techniques will be described subsequently. First, an improved conventional arrangement will be described with reference to FIG. 9. It is to be noted that like elements to those of FIG. 7 are denoted by like reference characters in FIG. 9.

When data at certain column addresses n and n+1 are to be read out, a column decoder $CD_n$ is selected in accordance with a column address n. In the case where such column address n is 255, column decoders CD255 and CD-1 are selected. When the column address n is an even number, for example, when n=2, a column decoder CD2 is selected, and then the level at a signal line SL0 is put into a high potential by an LBS selecting circuit 20. Consequently, two column gate transistors G2 and G3 are opened. As a result, data of memory cells MC2 and MC3 are read out into data output lines I/00 and I/01, respectively. On the other hand, in case the column address n is an odd number, for example, when n=1, a column decoder CD1 is selected level at a signal line SL1 is put to a high potential, two column gate transistors G1 and G2 are opened. As a result, data of memory cells MC1 and MC2 are read out into data output lines I/01 and I/00, respectively. As a column decoder $CD_n$ and the signal line SL0 (when the column address n is an even number) or the signal line SL1 (when the column address n is an odd number) are selected in this manner, data at the desired column addresses n and n+1 can be read out at a time into an I/0 line selecting buffer 10.

Furthermore, when data of 2 bits are to be transferred to a temporary register 90 while the dual port memory is in a reading/transferring mode, decoding is not performed at the I/0 line selecting buffer 10, and when the column address n is an even number, the data output lines I/00 and I/01 are connected to data lines 400 and 450, respectively, but when the column address n is an odd number, the data output lines I/00 and I/01 are connected to the data lines 450 and 400, respectively. Then, since a gate 60 is closed while another gate 65 is open, data at the column addresses n and n+1 are finally transferred to and stored into the temporary register 90 at a time.

On the other hand, in an ordinary reading mode, it is only necessary that data at a column address n can be transferred to an output buffer 50. Accordingly, decoding is performed for a least significant bit (LSB) of a column address signal by the I/0 line selecting buffer 10, and finally decoded data are transferred to the data line 400. Since the gate 60 is open while the gate 65 is closed, only data at the column address n are sent to the output buffer 50 and outputted to the outside.

Also such an arrangement as shown in FIG. 10 has been proposed. Referring to FIG. 10, the arrangement shown includes a control section 100 which is similar to that of the arrangement shown in FIG. 9. When a column address n is received, a column address decoder CDn is selected so that the level at a column selecting line $CSL_n$ is changed to a high potential. The column selecting line $CSL_n$ places a pair of column gate transistors $GA_n$ and $GB_n$ connected thereto into a conducting condition so that data of memory cells $MC_n$ and $MC_{n+1}$ are read out into data output lines I/00 and I/01, respectively (when n is an even number) or into the data output lines I/01 and I/00, respectively (when n is an odd number). Operation of the arrangement after then, is similar to that described hereinabove in connection with the arrangement shown in FIG. 9.

In this manner, the improved conventional arrangements shown in FIGS. 9 and 10 are characterized in that bit lines $BL_n$ and $BL_{n+1}$ connected to memory cells $MC_n$ and $MC_{n+1}$, respectively, for each column address n are directly connected to the data output lines 1/00 and I/01 or I/01 and I/00, respectively, and two column decoders $CD_n$ and $CD_{n-1}$ can be connected to a single bit line $BL_n$. Accordingly, with the arrangements, it is possible in principle to have a construction such that an arbitrary number of bits not only from two column The two improved arrangements, however, have the following problems.

First, when the number of column addresses is N, a number of column decoders equal to $2^N$ is required, which is not advantageous to high integration. Further, as a second problem, it is impossible in principle to replace part of the arrangement with a spare element or elements.

The first problem will be described in more detail first. In the two improved arrangements, all bit lines must be decoded completely with the column decoders. Accordingly, a number of column decoders equal to the number of column addresses are required, which makes an obstacle to high integration. In most cases, particularly the RAM section of a dual port memory is required to be constituted so as to be able to effect block writing wherein same data are written at a time into columns of $2^i$ (i is an integer equal to or greater than 1) bits. To this end, a construction is employed in most cases such that a column of 21 bits is selected by way of a single column selecting line CSL to read out data into a $2^i$ pairs of data output I/00 lines, and $1/2^i$ decoding is effected by the I/0 line selecting buffer 10. However, since the number of column addresses n which belong to such a single column selecting line CSL is only two, block writing is generally impossible with any of the improved arrangements described above.

Subsequently as the second problem, since 2 bits are necessarily selected by way of a single column selecting line CSL, in case, for example, the column addresses 4 to 7 are replaced by a spare cells, when the column address is 3, it is necessary to access data at the memory cell MC3 of the normal column and at a memory cell of the first column of the spare memory cells, but such accessing is impossible with any of the conventional arrangements.

As described so far, the arrangement shown in FIG. 7 cannot cope with a pipeline interleave system, and the arrangements shown in FIGS. 9 and 10 which are improved in that point have critical problems as a RAM section for a dual port memory that high integration cannot be achieved readily and replacement of a faulty cell with a spare cell is impossible.

SUMMARY OF THE INVENTION

Accordingly, it is an object of the present invention to provide a semiconductor memory device which can employ a pipeline interleave system wherein data of 2 bits at a column address n and another column address n+1 are read out at a time.

It is another object of the present invention to provide a semiconductor memory device wherein data of 2 bits can be read out regularly even after a faulty cell is replaced by a spare cell.

According to the present invention, there is provided a semiconductor memory device, which comprises a memory cell array including a plurality of memory cells arranged in a matrix, a redundant memory cell array including a plurality of spare cells each of which is to be used, when one of the memory cells is a faulty memory cell, in place of such faulty memory cell, a plurality of bit line pairs for interconnecting the memory cells in a direction of a column, a plurality of spare bit line pairs for interconnecting the spare cells in a direction of a column, a column address information storage circuit having stored therein information of a column address of such faulty cell and a column address of a spare cell to be used in place of the faulty cell, the column address information storage circuit being connected to receive an input column address signal and operable in response to the input column address signal such that it selects, when the faulty cell does not belong to either of column addresses n and n+1, n being an integer equal to or greater than 0, a column decoder, when the faulty cell belongs to both of the column addresses n and n+1, it selects a spare column decoder, and when the faulty cell belongs to either one of the column addresses n and n+1, it selects a column decoder and a spare column decoder, a plurality of column decoders each for receiving and decoding, when selected by the column address information storage circuit, a column address signal to select a first or a second column selecting line, a first column selecting gate operable under the control of one of the first column selecting lines selected by the column decoders for connecting a corresponding one of the bit line pairs and a plurality of first data output line pairs to each other, a second column selecting gate operable under the control of one of the second column selecting lines selected by the column decoders for connecting an every m-1-th one of the bit line pairs and a second data output line pair to each other, m being an integer equal to or greater than 2, a spare column decoder for selecting, when selected by the column address information storage circuit, a third or a fourth column selecting line, a third column selecting gate operable under the control of the third column selecting line selected by the spare column decoder for connecting the spare bit line pairs and the first data output line pairs to each other, a fourth column selecting gate operable under the control of the fourth column selecting line selected by the spare column decoder for connecting the spare bit line pairs and the second data output line pair to each other, a first buffer for selecting, when data of m bits are received from the first data output line pairs, data from the column address n or the column addresses n and n+1 and amplifying and output the data, a second buffer for amplifying and outputting, when data of 1 bit are received from the second data output line pair, the data, and a register for receiving and storing therein data outputted from the first and/or second buffers, and wherein, when the successive column addresses n and n+1 belong to one of the first column selecting lines and do not include any faulty cell, a corresponding one of the column decoders is selected by the column address information storage circuit so that data of m bits connected to the first column selecting line of the selected column decoder are transmitted by way of the first column selecting gate and the first data output line pairs to the first buffer, at which the data from the column addresses n and n+1 are selected and amplified and then stored into the register, when the successive column addresses n and n+1 belong to two different ones of the first column selecting lines and do not include any faulty cell therein, two corresponding ones of the column decoders are selected by the column address information storage circuit so that data of m bits connected to one of the first column selecting lines to which the column address n belongs are transmitted by way of the first column selecting gate and the first data output line pairs to the first buffer, at which the data from the column address n are selected and amplified and then stored into the register, and data from the column address n+1 are transmitted by way of the second column selecting gate and the second data output line pair to the second buffer, at which the data are amplified and then stored into the register, when the successive column addresses n and n+1 both belong to one of the first column selecting lines and include a faulty cell therein, the spare column decoder is selected by the column address information storage circuit so that data of m bits connected to the third column selecting line of the spare column decoder are transmitted by way of the third column selecting gate and the first data output line pairs to the first buffer, at which the data from the column addresses n and n+1 are selected and amplified and then stored into the register, and when the successive column addresses n and n+1 are connected to two different ones of the first column selecting lines and a faulty column does not belong to the column address n but belongs to the column address n+1, one of the column decoders corresponding to the first column selecting line connected to the column address n and the spare column decoder are selected by the column address information storage circuit so that data of m bits connected to one of the first column selecting lines to which the column address n belongs are transmitted by way of the first column selecting gate and the first data output line pairs to the first buffer, at which the data from the column address n are selected and amplified and then stored into the register, while data at the column address n+1 are transmitted by way of the fourth column selecting gate and the second data output line pair to the second buffer, at which the data are amplified and then stored into the register, but when the successive column addresses n and n+1 belong to two different ones of the first column selecting lines and a faulty cell belongs to the column address n but does not belong to the column address n+1, the spare column decoder and one of the column decoders corresponding to the first column selecting line connected to the column address n+1 are selected by the column address information storage circuit so that data of m bits connected to the third column selecting line to which the column address n belongs are transmitted by way of the third column selecting gate and the first data output line pairs to the first buffer, at which the data from the column address n are selected and amplified and then stored into the register, while data from the column address n+1 are transmitted by way of the second column selecting gate and the second data output line pair to the second buffer, at which the data are amplified and then stored into the register.

When the successive column addresses n and n+1 belong to one of the first column selecting lines and do not include any faulty cell, a corresponding one of the column decoders is selected by the column address information storage circuit. By the column decoder, a first column selecting line to which the column addresses n and n+1 belong is selected, and corresponding m bit line pairs and the first data output line pairs are connected to each other by the first column selecting gate which is controlled by the first column selecting line. Consequently, data of m bits are transmitted by way of the first data output line pairs to the first buffer, at which the data from the column addresses n and n+1 are selected and amplified and then stored into the register.

When the successive column addresses n and n+1 belong to two different ones of the first column selecting lines and do not include any faulty cell therein, two corresponding ones of the column decoders are selected by the column address information storage circuit. One of the first column selecting lines to which the column address n belongs is selected by the selected column address decoder, and corresponding m bit line pairs and the first data output line pairs are connected to each other by the first column selecting gate which is controlled by the selected first column selecting line. Consequently, data of m bits are transmitted by way of the first data output line pairs to the first buffer, at which the data from the column address n are selected and amplified and then stored into the register. Further, one of the second column selecting lines to which the column address n+1 belongs is selected by the selected column decoder, and a corresponding bit line pair and the second data output line pair are connected to each other by the second column selecting gate which is controlled by the selected second column selecting line. Consequently, data of 1 bit are transmitted by way of the second data output line pair to the second buffer, at which the data are amplified and then stored into the register.

When the successive column addresses n and n+1 both belong to one of the first column selecting lines and include a faulty cell therein, the spare column decoder is selected by the column address information storage circuit. The third column selecting line to be selected in place of the first column selecting line to which the column addresses n and n+1 belong is selected by the spare column decoder, and corresponding m spare bit line pairs and the first data output line pairs are connected to each other by the third column selecting gate which is controlled by the third column selecting line. Consequently, data of m bits are transmitted by way of the first data output line pairs to the first buffer, at which the data from the column addresses n and n+1 are selected and amplified and then stored into the register.

When the successive column addresses n and n+1 are connected to two different ones of the first column selecting lines and a faulty column belongs to one of such two first column selecting lines, a column decoder and the spare column decoder are selected by the column address information storage circuit. When the faulty cell belongs to that one of the two first column selecting lines to which the column address n belongs, the third column selecting line which is to be selected by the first column selecting line to which the column address n belongs is selected by the spare column decoder, and corresponding m bit line pairs and the first data output line pairs are connected to each other by the third column selecting gate which is controlled by the third column selecting line. Consequently, data of m bits are transmitted by way of the first data output line pairs to the first buffer, at which the data from the column address n are selected and amplified and then stored into the register. Further, as regards the other column address n+1 to which a normal cell belongs, one of the second column selecting lines to which the column address n+1 belongs is selected by the selected column decoder, and a corresponding bit line pair and the second data output line pair are connected to each other by the second column selecting gate which is controlled by the selected second column selecting line. Consequently, data of 1 bit are transmitted by way of the second data output line pair to the second buffer, at which the data are amplified and then stored into the register.

On the contrary, when a faulty cell is present in that one of the two first column selecting lines to which the column address n+1 belongs, the fourth column selecting line to be selected in place of the second column selecting line to which the column address n+1 belongs is selected by the spare column decoder, and corresponding m bit line pairs and the second data output line pair are connected to each other by the fourth column selecting gate which is controlled by the fourth column selecting line. Consequently, data of 1 bit are transmitted by way of the second data output line pair to the second buffer, at which the data are amplified and then stored into the register. Further, as regards the other column address n to which a normal cell belongs, one of the first column selecting lines to which the column address n belongs is selected by the selected column decoder, and corresponding m bit line pairs and the first data output line pairs are connected to each other by the first column selecting gate which is controlled by the selected first column selecting line. Consequently, data of m bits are transmitted by way of the first data output line pairs to the first buffer, at which the data are amplified and then stored into the register. In this manner, also in case the column addresses n and n+1 correspond to two different ones of the address selecting lines, data can be read out without any trouble. Further, where a faulty cell is replaced by a spare cell, while several different combinations are available with a column address, in any case, read-out of data can be effected without any trouble.

When a faulty cell is present, only one of the column addresses n and n+1, two different combinations are available. Thus, the column address information storage circuit includes first and second storage circuits which operate such that, when the faulty cell belongs to the column address n, only the output of the first storage circuit varies, but when the faulty cell belongs to the column address n+1, only the output of the second storage circuit varies. Accordingly, the two different cases can be distinguished from each other.

Similarly, also where the column address information storage circuit includes a first storage circuit, and a second storage circuit to which a column address obtained by addition of the value to an input column address by way of an adder is inputted, when the faulty cell belongs to the column address n, only the output of the first storage circuit varies, but when the faulty cell belongs to the column address n+1, only the output of the second storage circuit varies. Accordingly, the two different cases can also be distinguished from each other.

BRIEF DESCRIPTION OF THE DRAWINGS

FIG. 4 is a diagram illustrating whether, when a column address n is given, each of the column addresses n and n+1 belongs to a normal column or a spare column and each of signals from a pair of fuses exhibits a high level or a low level;

DESCRIPTION OF THE PREFERRED EMBODIMENT

Figure 1:
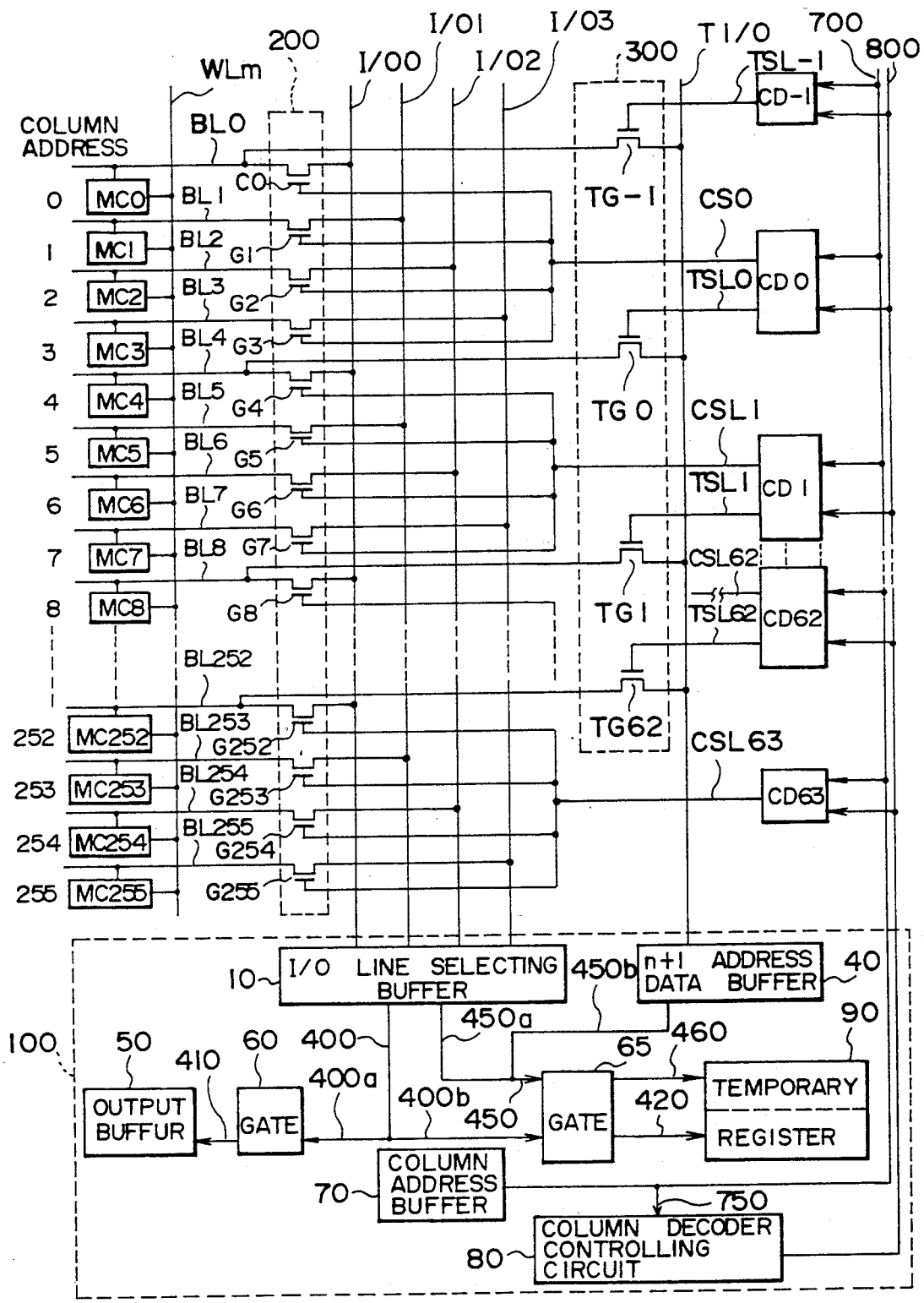
FIG. 1 is a circuit diagram showing major construction of a column address decoding system and an I/0 line system of a semiconductor memory device of an embodiment of the present invention.

Referring first to FIG. 1, there is shown a circuit construction of a column address decoding system and a data output line I/0 system of a semiconductor memory device according to a preferred embodiment of the present invention. Memory cells MC0 to MC255 are arranged in a direction of a row and correspond to column addresses 0 to 255, respectively. Similar memory cells are disposed in a similar manner for each row, but are not shown in FIG. 1. The memory cells MC0 to MC255 of the row shown are selected by way of a word line WL$_m$ among a plurality of word lines. The memory cells MC0 to MC255 are connected to bit lines BL0 to BL255, respectively, along which data read out therefrom are transferred in a direction of a column. While normally a pair of bit lines are connected to each memory cell, such bit lines are indicated by a single line in FIG. 1 to facilitate illustration.

A pair of column selecting gates 200 and 300 are connected in parallel to each other to the bit line pairs BL0 to BL255. The row selecting gate 200 includes column gate transistors G0 to G255 for the individual columns, and the drains of the column gate transistors G0 to G255 are connected to the bit lines BL0 to BL255, respectively, while the sources of them are connected, for each four column gate transistors such as the transistors G0 to G3 or G4 to G7, to four different data input/output lines I/00 to I/03.

The gates of the column gate transistors G0 to G255 are connected for each four column gate transistors to same decoders CD0 to CD63 by way of row selecting lines CSL0 to CSL63, respectively, in such a manner that, for example, all of the gates of the column gate transistors G0 to G3 are connected to the column decoder CD0 and all of the gates of the column gate transistors G4 to G7 are connected to the column decoder CD1.

Meanwhile, the column selecting gate 300 includes column gate transistors TG-1 to TG62. The bit lines BL0 to BL255 are connected for every fourth bit lines to the drains of the column gate transistors TG-1 to TG62, respectively, in such a manner that, for example, the bit line BL0 is connected to the column gate transistor TG-1; the bit line BL4 is connected to the column gate transistor TG0; and the bit line BL8 is connected to the column gate transistor TG1.

The sources of the column gate transistors TG-1 to TG62 are all connected to a data output line TI/0. The gates of the column gate transistors TG-1 to TG62 are connected to the column decoders CD-1 to CD62 by way of column selecting lines TSL-1 to TSL62, respectively. Further, the column decoders CD-1 to CD63 are individually connected to a pair of sets of signal lines 700 and 800.

The data input/output lines I/00 to I/03 and the data output lines TI/0 and signal lines 700 and 800 are connected to a control section 100. The control section 100 includes an output buffer 50, a pair of gates 60 and 65, an I/0 line selecting buffer 10, an n+1 address data buffer 40, a temporary register 90, a column address buffer 70 and a column decoder controlling circuit 80. The I/0 line selecting buffer 10 is connected to the data output lines I/00 to I/03 and also connected to the gates 60 and 65 by way of data lines 400a and 400b, respectively. The gate 65 is further connected to the I/0 line selecting buffer 10 by way of a data line 450a and also to the n+1 address data buffer 40 by way of another data line 450b. The gate 65 is connected to the temporary register 90 by way of a pair of parallel data lines 420 and 460. The column address buffer 70 is connected to the signal lines 700 while the column decoder controlling circuit 80 is connected to the other signal line decoder controlling lines 800, and the column address buffer 70 and column decoder controlling circuit 80 are connected to each other by way of a signal line 750.

Figure 2:
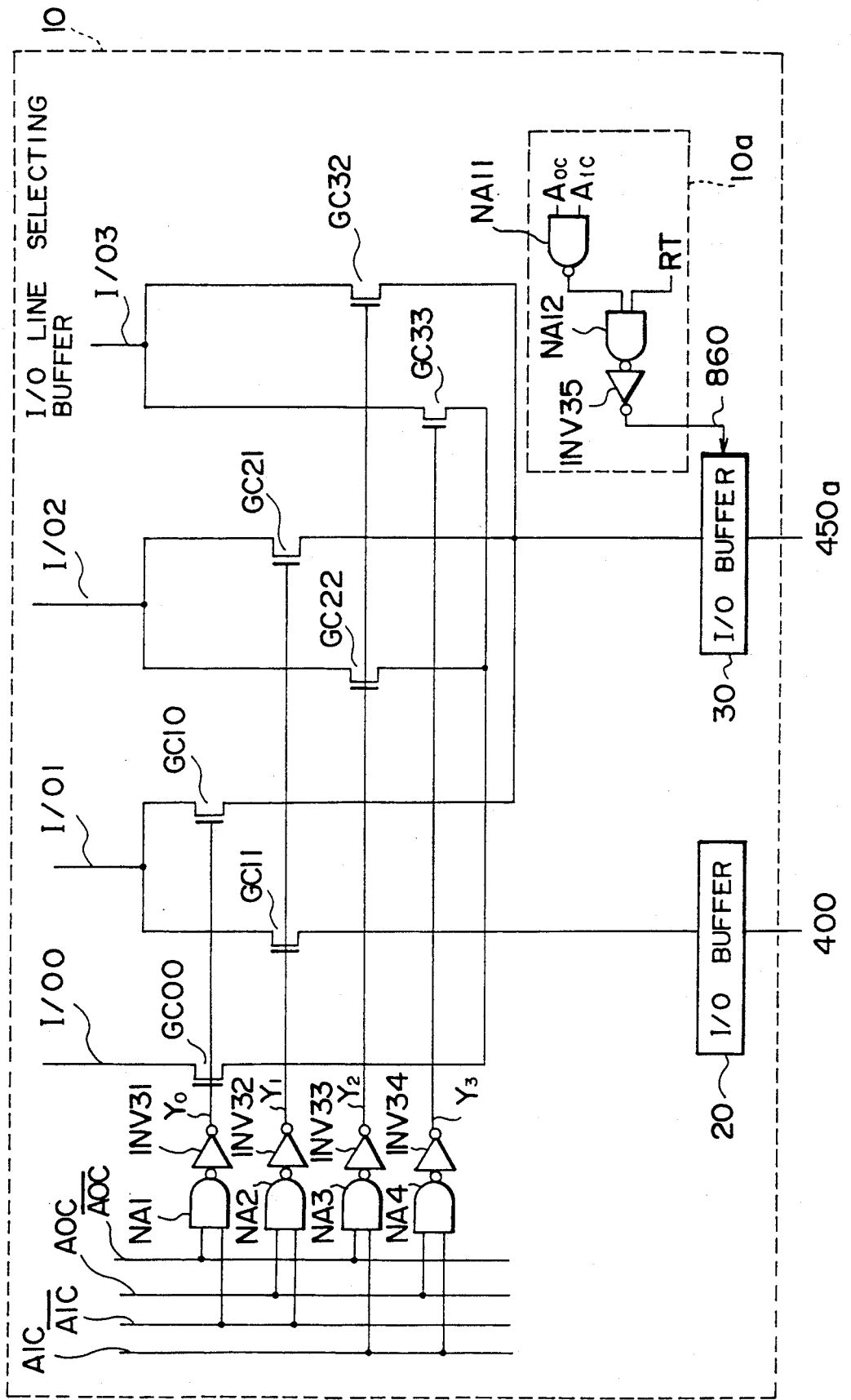
FIG. 2 is a circuit diagram showing an I/0 line selecting buffer of the semiconductor memory device of FIG. 1.

A detailed circuit construction of the I/0 line selecting buffer 10 is shown in FIG. 2. Referring to FIG. 2, the I/0 line selecting buffer 10 includes a NAND circuit NA1 connected to receive, from the outside, two signals A1C and $\overline{A1C}$ and $\overline{A0C}$ among four signals A1C, $\overline{A1C}$, A0C and $\overline{A0C}$ from which selecting signals Y0 to Y3 are to be produced, another NAND circuit NA2 connected to receive the signals $\overline{A1C}$ and A0C, a further NAND circuit NA3 connected to receive the signals A1C and $\overline{A0C}$, and a still further NAND circuit NA4 connected to receive the signals A1C and A0C. The NAND circuits NA1 to NA4 are connected in parallel and have output terminals to which input terminals of invertors INV31 to INV34 are connected, respectively. An output terminal of the invertor INV31 is connected to the gates of a pair of transistors GC00 and GC10, and an output terminal of the invertor INV32 is connected to the gates of another pair of transistors GC11 and GC21. Meanwhile, an output terminal of the invertor INV33 is connected to the gates of a further pair of transistors GC22 and GC32, and an output terminal of the invertor INV34 is connected to the gate of a transistor GC33.

The drain of the transistor GC00 is connected to the data output line I/00, and the drains of the transistors GC11 and GC10 are connected to the data output line I/01. The drains of the transistors GC21 and GC22 are connected to the data output line I/02, and the drains of the transistors GC32 and GC33 are connected to the data output line I/03.

The sources of the transistors GC00, GC11, GC22 and GC33 are connected to an input terminal of an I/0 buffer 20, and the sources of the transistors GC10, GC21 and GC32 are connected to an input terminal of another I/0 buffer 30. Output terminals of the I/0 buffers 20 and 30 are connected to the output lines 400 and 450a, respectively. Further, a circuit 10a including a pair of NAND circuits NA11 and NA12 and an invertor INV35 is connected to the I/0 buffer 30 by way of a signal line 860. The NAND circuit NA11 is connected to receive, at two input terminals thereof, such two signals A0C and A1C as described hereinabove, and an output terminal thereof is connected to one of a pair of input terminals of the NAND circuit NA12. A signal RT is inputted to the other input terminal of the NAND circuit NA12, and an output terminal of the NAND circuit NA12 is connected to an input terminal of the invertor INV35, an output terminal of which is connected to the signal line 860. Here, the signal RT to be inputted to the NAND circuit NA12 presents a high level only in a reading/transferring mode, and a signal 860 to be outputted from the invertor INV35 exhibits a variation to a level at which the I/0 buffer 30 operates only when the column address n is 4j+3 in a reading/transferring mode.

The I/0 line selecting buffer 10 operates in the following manner. In particular, four data are inputted from the data output lines I/0 to the I/0 line selecting buffer 10 as hereinafter described. One or two corresponding ones of the four data are selected in response to selecting signals Y0 to Y3 and are amplified by the I/0 buffer 20 or 30 or buffers 20 and 30.

When the column address n has any value other than 4j+3, for example, 4j, the input signals A0C and A1C are both equal to 0, and consequently, only the selecting signal Y0 presents a high level while the other selecting signals Y1 to Y3 present a low level. Consequently, only the transistors GC00 and GC10 are rendered conducting, and data received by way of the data output lines I/00 and I/01 are inputted to the I/0 buffers 20 and 30, respectively. On the other hand, when the column address n is 4j+1, the transistors GC11 and GC21 are rendered conducting so that data transferred thereto by way of the data output lines I/01 and I/02 are inputted to the I/0 buffers 20 and 30, respectively, and when the column address n is 4j+2, the transistors GC22 and GC32 are rendered conducting so that data transferred thereto by way of the data output lines I/02 and I/03 are inputted to the I/0 buffers 20 and 30, respectively.

In this manner, when the column address n has any value other than 4j+3 and the semiconductor memory device is in a reading mode or a reading/transferring mode, data at column addresses n and n+1 are selected from among four data and amplified and then transferred to the data lines 400 and 450a. Then, in an ordinary reading mode, the I/0 buffer 30 does not operate, but only the data at the column address n are transferred from the I/0 buffer 20 to the data line 400 under the control of the circuit 10a.

On the other hand, when the column address n is 4j+3, only the selecting signal Y3 presents a high level. Consequently, only the transistor GC33 is rendered conducting so that data transferred thereto by way of the data output line I/03 are inputted to the I/0 buffer 20. The data are amplified by the I/0 buffer 20 and then outputted to the data line 400. In this instance, the I/0 buffer 30 does not operate under the control of the circuit 10a, and consequently, transfer of data to the data line 450a is not effected.

In this manner, the I/0 line selecting buffer 10 has a function of selecting and amplifying, in response to an operation mode and a column address n, those data at the column address n or column addresses n and n+1 from among data received from the data output lines I/0.

Operation of the circuit of the embodiment having such construction as described above will be described subsequently with reference to FIG. 1. First, in an ordinary reading mode wherein single data at a column address n are to be read out, the circuit operates in the following manner. In case the column address n is 3, a column address signal of 3 inputted to the column address buffer 70 is amplified by the same so that the column decoder CD0 is selected by way of the signal lines 700. The column selecting lines CSL0 and TSL0 are connected to the column decoder CD0. However, the column decoder CD0 is controlled by the column decoder controlling circuit 80 so that the column gate transistor TG0 of the column selecting gate 300 may not be rendered conducting by the column selecting line TSL0 except when the semiconductor memory device is in a transferring mode.

Accordingly, in this case, only the column gate transistors G0 to G3 of the column selecting gate 200 are rendered conducting by the column decoder CD0 by way of the column selecting line CSL0. Consequently, data of the memory cells MC0 to MC3 whose column addresses are 0 to 3, respectively, are read out and inputted to the I/0 line selecting buffer 10 by way of the data output lines I/00 to I/03, respectively.

At the I/0 line selecting buffer 10, only the data from the memory cell MC3 among the data from the memory cells MC0 to MC3 are selected and amplified as described hereinabove and then outputted to the data line 400. In the case of a reading operation, only the gate 60 of the gates 60 and 65 is opened, and the data from the I/0 line selecting buffer 10 are outputted from the output buffer 50 to the outside by way of the data lines 400a and 410. A similar operation is also effected when the column address has any value other than 3.

Subsequently, operation of the circuit shown in FIG. 1 when the semiconductor memory device is in a reading/transferring mode and data at two successive column addresses n and n+1 are to be read out and stored into the temporary register 90 will be described. First, when such column addresses n and n+1 belong to a same column selecting line CSL, that is, the column address has any other value than 4j+3 (j is an integer equal to or greater than 0). Taking the case wherein the column address n is 5 as an example, the column decoder CD1 is selected. While the column selecting lines CSL1 and TSL1 are connected to the column decoder CD1, the column selecting gate 300 is not opened, under the control of the column decoder controlling circuit 80, except when the column address n is 4j+3. Consequently, the column gate transistors G4 to G7 of the column selecting gate 200 are rendered conducting so that data of 4 bits are read out into the data output lines I/00 to I/03.

Among the data thus read out, only the data at the column addresses n and n+1 are amplified by the I/0 line selecting buffer 10 and outputted into the data lines 400 and 450a. Meanwhile, the n+1 address data buffer 40 and the gate 60 remain in an inoperative condition under the control of the column decoder controlling circuit 80. The gate 65 is in an open condition, and consequently, the two data from the I/0 line selecting buffer 10 are transferred into the data lines 420 and 460 by way of the gate 65. As a result, the data from the column addresses n and n+1, are stored into the 2-bit temporary register 0. In this manner, except when the column address has any value other than 4j+3, two bits among data read out into the data output lines I/0 are selected and amplified and then stored into the temporary register 90.

When the semiconductor memory device shown in FIG. 1 is in a reading/transferring mode and the column addresses n and n+1 are connected to different column selecting lines CSL, that is, the column address n is 4j+3, the semiconductor memory device operates in the following manner. When the column address n is, for example, 7, the column decoder CD1 is selected. Then, when the semiconductor memory device is in a reading mode and the column address n is 4j+3, the column gate transistors G4 to G7 of the column selecting gate 200 and the column gate transistor TG1 of the column selecting gate 300 are selected in response to outputs of the column decoder CD1 and the column decoder controlling circuit 80. Consequently, data stored in the memory cells MC4 to MC7 whose column addresses n are 4 to 7, respectively, are read out into the data output lines I/00 to I/03, respectively, while data stored in the memory cell MC8 whose column address n is 8 are read out into the data output line TI/0.

Then, the data thus read out from the column addresses 4 to 7 are transmitted to the I/0 line selecting buffer 10 while the data from the column address 8 are transmitted to the n+1 address data buffer 40. Only the data from the column address 7 are selected and amplified by the I/0 line selecting buffer 10. Meanwhile, the data from the column address 8 are amplified by the n+1 address data buffer 40.

The thus amplified data from the column address 7 are outputted into the data line 400. In this instance, the gate 60 is in a closed condition while the gate 65 is in an open condition. Consequently, the data from the column address 7 are transmitted to and stored into the temporary register 90 by way of the data line 420. Meanwhile, the data from the column address 8 are outputted from the n+1 address data buffer 40 and transferred to the data line 460 by way of the gate 65 so that they are stored into the temporary register 90 at the same time with the data from the column address 7.

When the column address n has its highest value, that is, 255 here, the other column address n+1 from which data are to be read out simultaneously is 0. When the column address n ranges from 252 to 255, the corresponding column decoder is the column decoder CD63. However, the column address 255 and the column address 0 are spaced by a great distance from each other, and the memory cell MC0 whose column address is 0 cannot be accessed from the column decoder CD63. Therefore, in order to permit data to be read out from the column address 0, the column decoder CD-1 is provided for the exclusive use, and further, the column gate transistor TG-1 is provided in the column selecting gate 300 to which an output of the column data decoder CD-1 is to be transmitted.

Accordingly, when the semiconductor memory device is in a reading/transferring mode and the column address n is 255, both of the column decoders CD63 and CD-1 are selected by the column decoder controlling circuit 80. Thus, data of the memory cells MC252 to MC255 are read out into the data output lines I/00 to I/03, respectively, while data at the column address 0 are read out into the data output line TI/00. Operation after then is similar to that of the case when the column address n has any other value than 255, and data at the column address 255 and data at the column address 0 are stored into the temporary register 90.

Figure 9:
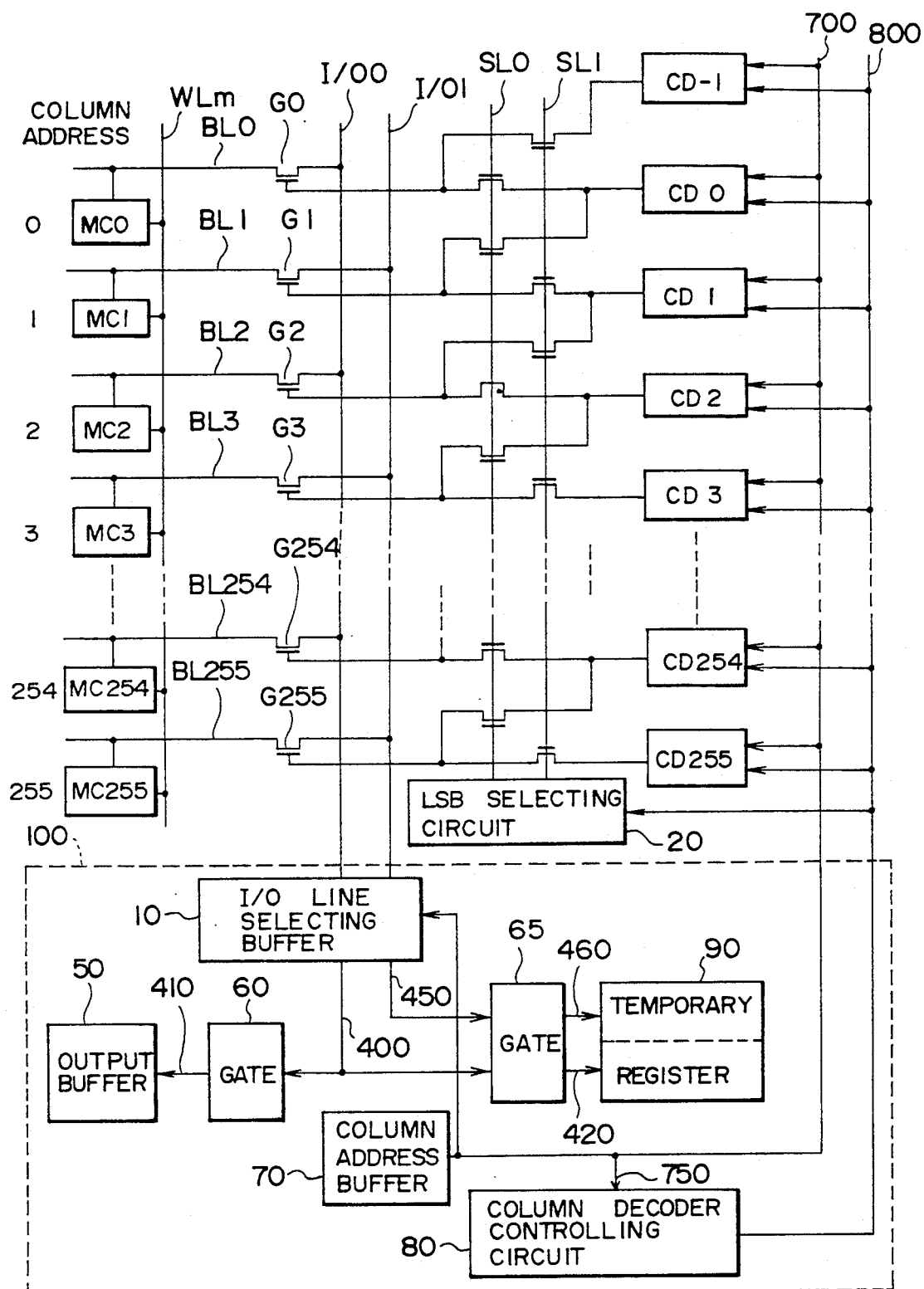
FIG. 9 is a circuit diagram showing an improvement to the semiconductor memory device shown in FIG. 7.
Figure 10:
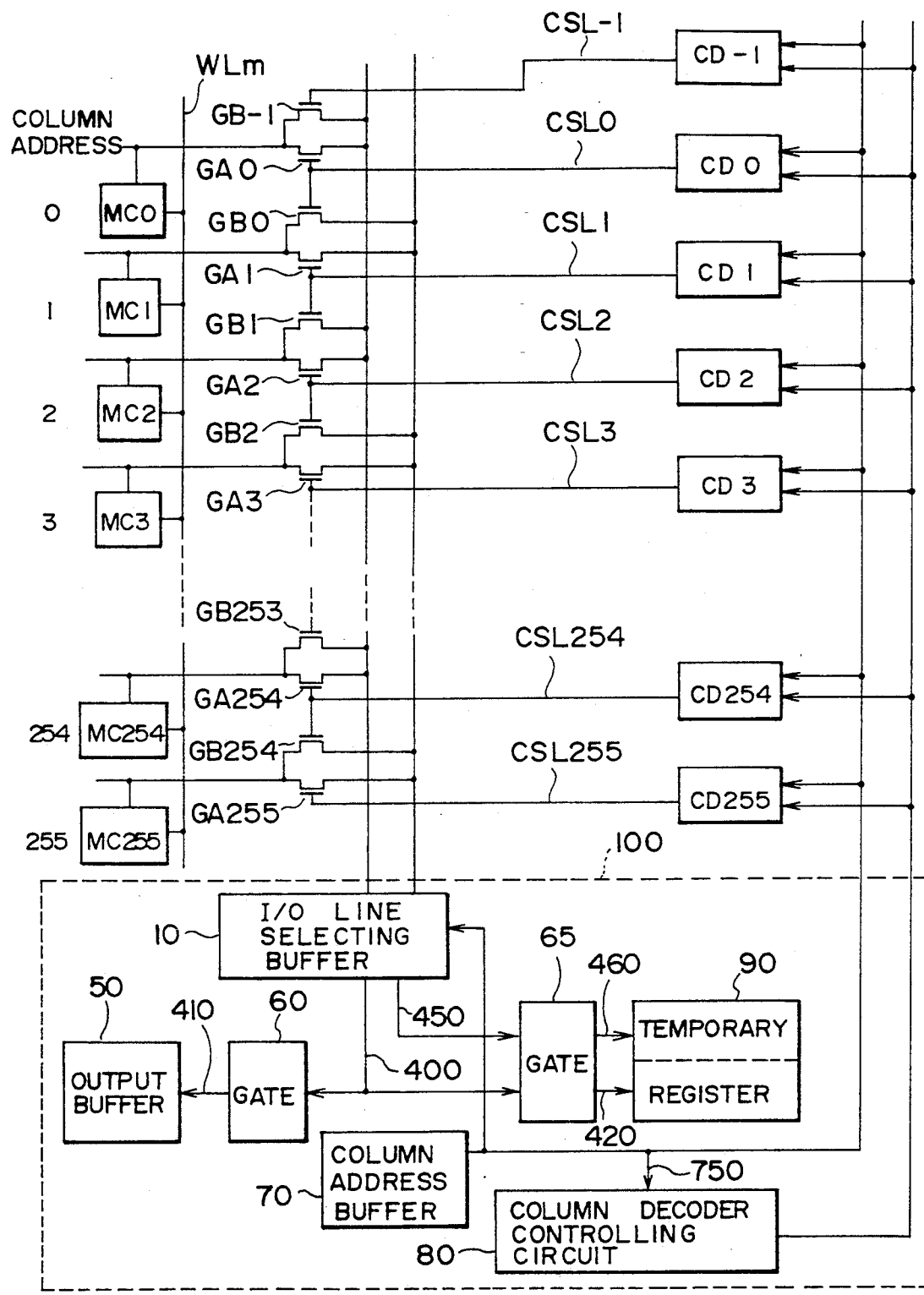
FIG. 10 is a circuit diagram showing another improvement to the semiconductor memory device shown in FIG. 7.

In this manner, not only can data be read out from any column addresses n and n+1 without any trouble, but also the number of column decoders CD can be reduced significantly as different from the conventional devices shown in FIGS. 9 and 10. Consequently, high integration can be achieved.

Figure 3:
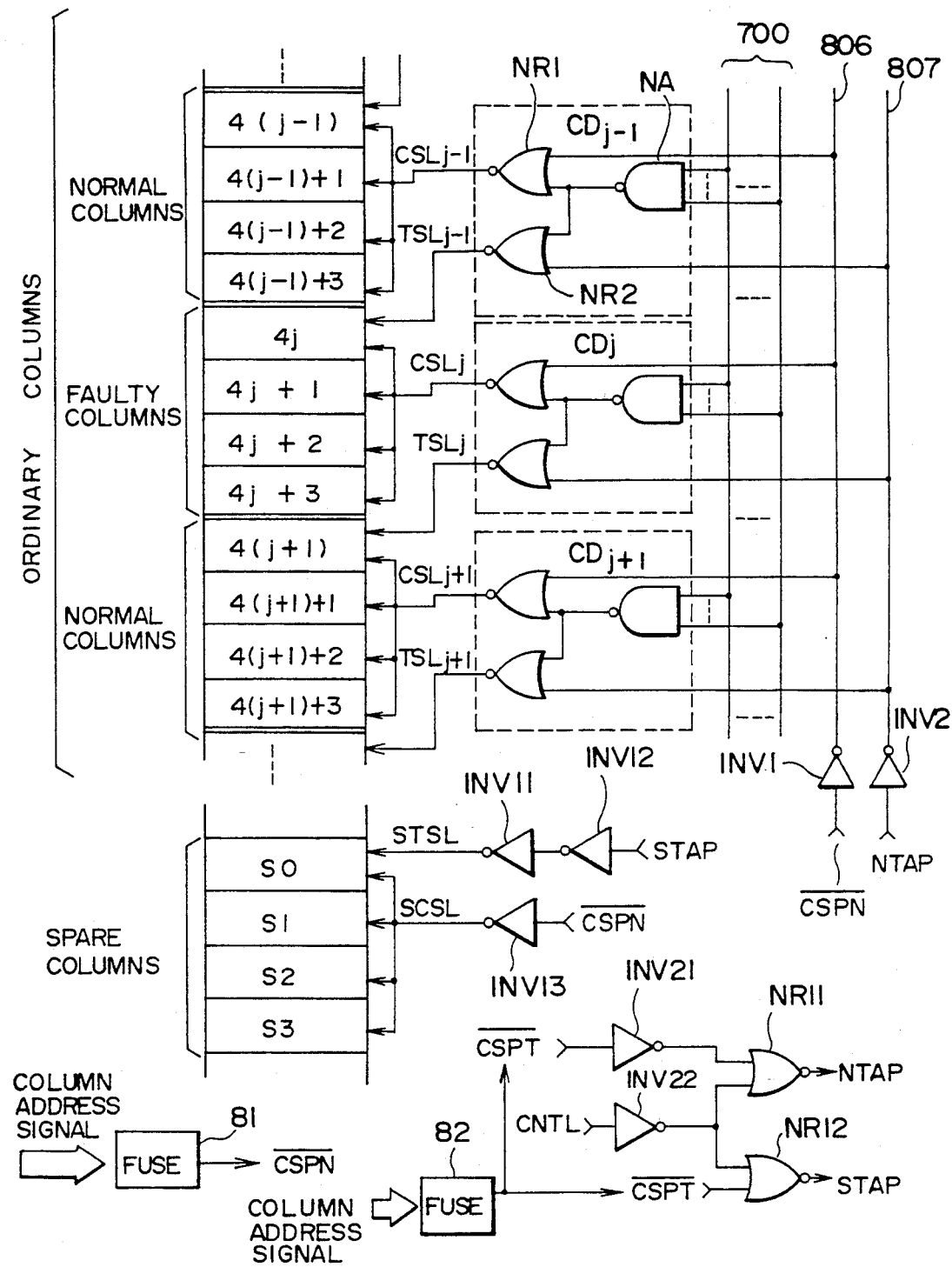
FIG. 3 is a circuit diagram showing a decoding system of the semiconductor memory device of FIG. 1 wherein a faulty column is replaced with a spare column.
Figure 5:
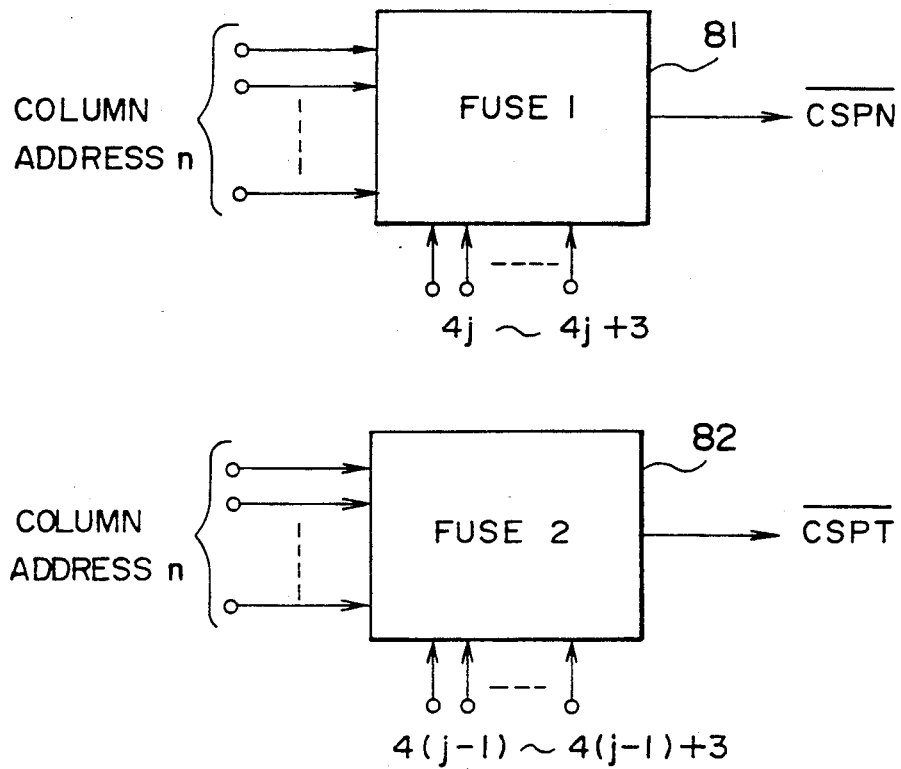
FIG. 5 is a block diagram illustrating a relationship between column addresses when information of a faulty column is written into the fuses of the semiconductor memory device of FIG. 1 and column addresses upon normal operation of the semiconductor memory device.

Subsequently, construction of an address decoder circuit when a faulty cell is present in a semiconductor memory device of the present embodiment will be described with reference to FIG. 3. Here, the data output lines I/0 and TI/0 and controlling sections have a similar construction to that shown in FIG. 1, and accordingly, they are omitted in FIG. 3. The semiconductor memory device includes, as ordinary columns, columns of column addresses 4(j−1) to 4(j−1)+3, 4j to 4j+3, 4(j+1) to 4(j+1)+3 and so forth. Here, it is assumed that, of the ordinary columns, the ordinary columns 4(j−1) to 4(j−1)+3, 4(j+1) to 4(j+1)+3 and so forth are normal columns which operate normally, but the ordinary columns 4j to 4j+3 are faulty columns in which a faulty cell is present. Such faulty columns are replaced by spare columns S0 to S3.

Memory cells of those of the ordinary columns whose column addresses are 4(j−1) to 4(j−1)+3 and the column decoder CDj-1 are connected to each other by way of the column selecting line CSLj-1 while a memory cell whose column address is 4j and the column decoder CDj-1 is connected to each other by way of the column selecting line TSLj-1. Similarly, memory cells whose column address are 4j to 4j+3 and the column decoder CDj are connected to each other by way of the column selecting line CSLj while a memory cell whose column address is 4(j+1) and the column decoder CDj are connected to each other by way of the column selecting line TSLj.

Similar connections are established for memory cells whose column addresses are 4(j+1) to 4(j+1)+3. Each of the column decoders CD includes a pair of NOR circuits NR1 and NR2 and a NAND circuit NA, and for example, in the case of the column decoder CDj-1, an output terminal of the NOR circuit NR1 and the column selecting line CSLj-1 are connected to each other while the column selecting line TSLj-1 and an output terminal of the NOR circuit NR2 are connected to each other. One of a pair of input terminals of the NOR circuit NR1 is connected to a signal line 806, and the other input terminal of the same is connected to one of a pair of input terminals of the NOR circuit NR2 and an output terminal of the NAND circuit NA. The other input terminal of the NOR circuit NR2 is connected to another signal line 807. The two input terminals of the NAND circuit NA are individually connected to the column address lines 700. The signal line 806 is connected to an output terminal of an invertor INV1 while the signal line 807 is connected to an output terminal of another invertor INV2. A signal $\overline{CSPN}$ is inputted to an input terminal of the invertor INV1 while a signal NTAP is inputted to an input terminal of the invertor INV2.

The spare column S0 among the spare columns S0 to S3 whose column address is 0 is connected to an output terminal of an invertor INV11 by way of a spare column selecting line STSL, and an input terminal of the invertor INV11 is connected to an output terminal of another invertor INV12. Further, the spare columns S0 to S3 are all connected to an input terminal of a further invertor INV13 by way of a spare column selecting line SCSL. A signal STAP is inputted to an input terminal of the invertor INV12 while a signal $\overline{CSPN}$ is inputted to an input terminal of the invertor INV13.

Information for which column address a faulty memory cell is present, is written in a pair of fuses 81 and 82. Of the two fuses 81 and 82, the fuse 81 is programmed by selective melting of internal fuses not shown therein in advance such that, when a column address of any of 4j to 4j+3 is received, a signal $\overline{CSPN}$ of a low level may be developed. Meanwhile, the other fuse 82 is programmed so that, when a column address signal of any of 4(j−1) to 4(j−1)+3 is received, a signal $\overline{CSPT}$ of a low level may be developed.

When a column address signal is received, the fuse 81 outputs a signal $\overline{CSPN}$ to the output line 806 and the input terminal of the invertor INV13. Meanwhile, an output terminal of the fuse 82 is connected to the input terminal of the invertor INV21 and one of a pair of input terminals of a NOR circuit NR12. The other input terminal of the NOR circuit NR12 is connected to one of a pair of input terminals of another NOR circuit NR11 and an output terminal of an invertor INV22, and an output terminal of another invertor INV21 is connected to the other input terminal of the NOR circuit NR11. A signal CNTL is inputted to an input terminal of the invertor INV22. The signal CNTL presents a high level only when the semiconductor memory device is in a reading mode and the two column addresses n and n+1 correspond to two different column selecting lines CSL, that is, the column signal n is 4j+3. in the present embodiment.

When information of column addresses (4j to 4j+3 here) in which a faulty cell is present is to be written into the fuses 81 and 82, a column address n to be provided upon writing and a column address signal to be inputted upon operation have such a following relationship as described below. In particular, as described hereinabove, the fuse 81 outputs a signal $\overline{CSPN}$ of a low level when the column address n ranges from 4j to 4j+3 while the fuse 82 outputs a signal $\overline{CSPT}$ of a low level when the column address n ranges from 4(j−1) to 4(j−1)+3. In this manner, the fuses 81 and 82 have a relationship wherein the column addresses n are displaced by four from each other.

Accordingly, when a same column address n is to be provided to the fuses 81 and 82 upon operation, it is necessary to provide, upon writing, information for column addresses of 4j to 4j+3 to the fuse 81 but to provide, to the fuse 82, information of column addresses 4(j−1) to 4(j−1)+3 which are individually displaced by four from the addresses to the fuse 81.

Figure 6:
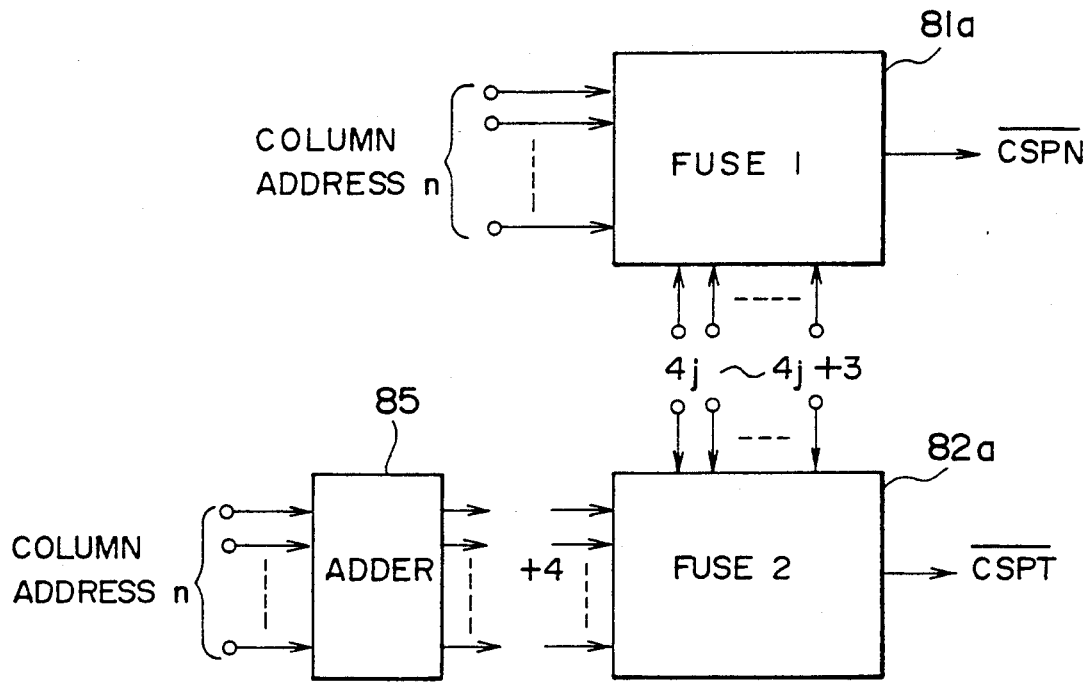
FIG. 6 is a block diagram illustrating a relationship between column addresses when information of a faulty column is written into such fuses of a modified semiconductor memory device of FIG. 1 and column addresses upon normal operation of the modified semiconductor memory device.
Figure 7:
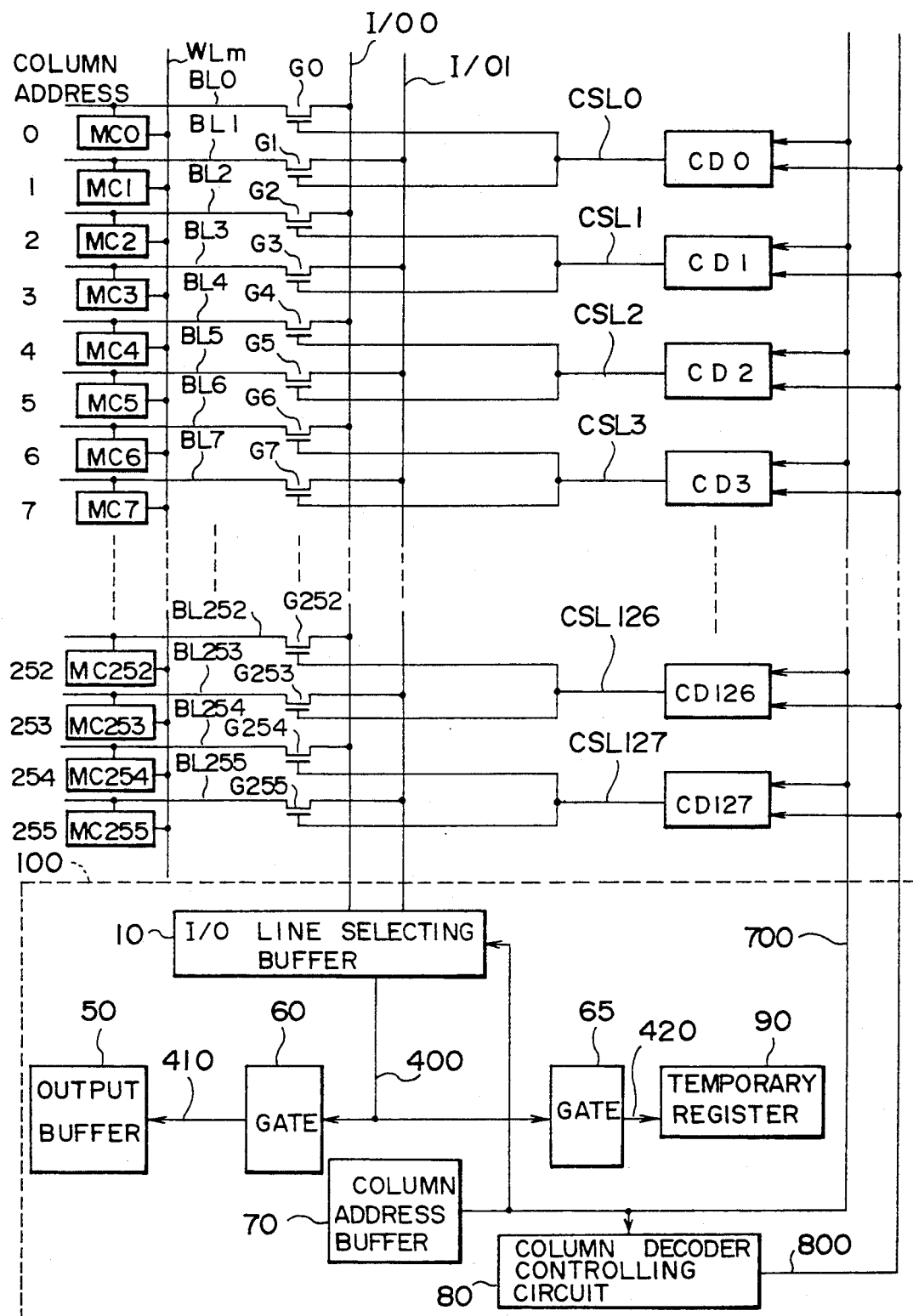
FIG. 7 is a circuit diagram showing major construction of a column address decoding system and an I/0 line system of a conventional semiconductor memory device.
Figure 8:
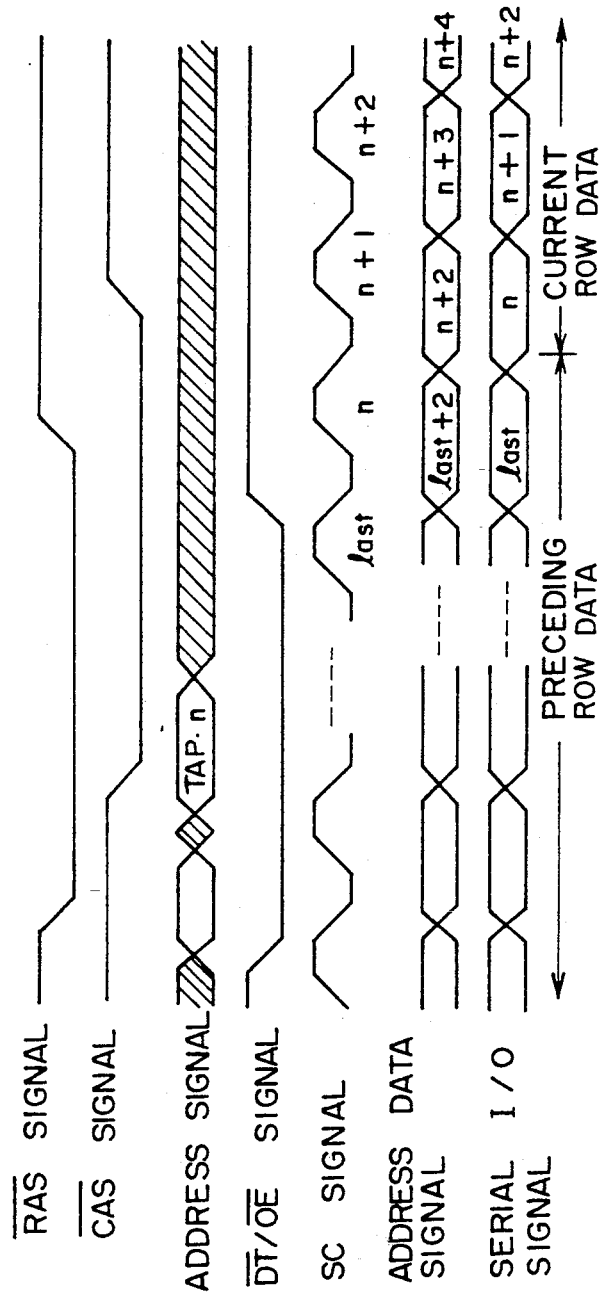
FIG. 8 is a timing chart showing operation waveforms of several controlling signals of the semiconductor memory device of FIG. 7 when serial accessing is effected in accordance with a pipeline interleave system.

On the contrary, when information of a same column address is to be provided, upon writing, to fuses 81a and a as in the case shown in FIG. 6, it is necessary to connect an adder 85 to input terminals of the fuse 82a. The adder 85 receives information for a column address n and outputs information of a value n+4 obtained by addition of 4 to n. Consequently, the fuse a can output a signal $\overline{CSPT}$ of a low level when the column address n ranges from 4(j−1) to 4(j−1)+3.

The circuit of FIG. 3 having such construction as described above operates in the following manner. First, when a normal column is selected, the control signal CNTL has a low level, and the column selecting lines TSL on the ordinary columns side and the column selecting line STSL on the spare columns side all have a low level. Consequently, neither of memory cells connected to the column selecting lines is accessed. When the column address n has any value other than 4j to 4j+3, the output signal $\overline{CSPN}$ of the fuse 81 presents a high level and is inverted by the invertor INV1 so that a signal of a low level is outputted into the signal line 806. The signal of a low level is transmitted to the NOR circuits NR1 of the column decoders CD. Consequently, one of the column selecting lines CSL is selected in response to levels at the column address signal lines 700. Further, in this instance, the signal $\overline{CSPN}$ of a high level is inputted to the invertor INV13 so that the spare column selecting line SCSL is kept at a low level. Accordingly, four data on the ordinary columns side at column addresses including the column address n are read out into the data output lines I/0 not shown. Also the present embodiment includes a circuit similar to the control section 100 shown in FIG. 1. The data of 1 bit from the column address n among the four data thus read out are selected and amplified by the I/0 line selecting buffer 10.

When the column address n corresponds to one of the faulty columns whose addresses are 4j to 4j+3, the signal $\overline{CSPN}$ outputted from the fuse 81 presents a low level. Consequently, the column selecting lines CSL on the ordinary columns side are not selected, but the spare column selecting line SCSL is selected. Consequently, four data are read out from the spare columns into the data output lines I/0, and the data of one bit from the column address n are selected and amplified by the I/0 line selecting buffer 10.

In this manner, in an ordinary reading mode, the signal CNTL of a low level is transmitted to the invertor 22, and none of the column selecting lines TSL on the ordinary columns side and the spare column selecting line STSL is selected. Accordingly, even when a faulty column is selected, the spare cells can be selected without any trouble.

Subsequently, operation of the semiconductor memory device when the semiconductor memory device is in a reading mode and data of two successive column addresses are read out and stored into the temporary register 90 will be described. Such operation is divided into the following four different cases (1) to (4) depending upon to what combination of the ordinary and spare columns the column addresses n and n+1 correspond as shown in FIG. 4.

(1) When the column addresses n and n+1 both correspond to normal columns (n≦4(j−1)+2 or n≧4(j+1)):

In this instance, the output signal $\overline{\text{CSPN}}$ of the fuse 81 presents a high level, and the output signal $\overline{\text{CSPT}}$ of the fuse 82 presents a low level when the column address n is any of $4(j-1)$ to $4(j-1)+2$ but presents a high level when the column address n has any other value.

(2) When the column address n corresponds to a normal column and the column address n+1 corresponds to a spare column (n=4(j−1)+3):

In this instance, the output signal $\overline{\text{CSPN}}$ of the fuse 81 presents a high level, and the output signal $\overline{\text{CSPT}}$ of the fuse 82 presents a low level.

(3) When the column addresses n and n+1 both correspond to spare columns ($4j \leq n \leq 4j+2$):

In this instance, the output signal $\overline{\text{CSPN}}$ of the fuse 81 presents a low level, and the output signal $\overline{\text{CSPT}}$ of the fuse 82 presents a high level.

(4) When the column address n corresponds to a spare column and the column address n+1 corresponds to a normal column (n=4j+3):

In this instance, the output signal $\overline{\text{CSPN}}$ of the fuse 81 presents a low level, and the output signal $\overline{\text{CSPT}}$ of the fuse 82 presents a high level.

Operation in the four cases (1) to (4) will be described in the following.

(1) When the column addresses n and n+1 both correspond to ordinary columns:

The output signal $\overline{\text{CSPN}}$ of the fuse 81 and the output signal $\overline{\text{CSPT}}$ of the fuse 82 both present a high level. When the column address n has any other value than 4j+3, a signal CNTL of a low level is inputted to the invertor INV22. Consequently, an output signal NTAP of the NOR circuit NR11 and an output signal STAP of the NOR circuit NR12 both present a low level. As a result, the column selecting lines TSL and the spare column selecting line STSL are not selected and present a low level.

Since the output signal $\overline{\text{CSPN}}$ of the fuse 81 presents a high level, one of the column decoders CD is selected in response to levels at the column address signal lines 700. Thus, data are read out from four memory cells connected to the column selecting line CS connected to the selected column decoder CD and then outputted into the data output lines I/0.

Operation of the semiconductor memory device after then is similar to that of the case described hereinabove wherein no faulty cell is present and the column address n has any other value than 4j+3, and finally, data of 2 bits from the column addresses n and n+1 are stored into the temporary register 90.

Also when the column address n is 4j+3, the output signals $\overline{\text{CSPN}}$ and $\overline{\text{CSPT}}$ of the fuses 81 and 82 both present a high level similarly. Accordingly, similar to the case wherein the column address n has any other value than 4j+3, an arbitrary column decoder CD is selected in response to levels at the column address signal lines 700, and data of memory cells connected to the selected column decoder CD are read out.

When the column address n is 4j+3, the signal CNTL presents a high level. While either one of the signals NTAP and STAP presents a high level in response to a level of the output signal $\overline{\text{CSPT}}$ of the fuse 82, since the signal $\overline{\text{CSPT}}$ presents a high level in this instance, also the signal NTAP presents a high level. Then, the signal NTAP of a high level is inverted by the invertor INV2, and consequently, data of 5 memory cells connected to the corresponding column selecting lines CSL and TSL are read out into the data output lines I/0 and TI/0. Operation after then is similar to that of the case wherein no faulty cell is present and the column address n is 4j+3, and finally, the two data from the column addresses n and n+1 are stored into the temporary register 90. In this manner, even when a faulty cell is present, read-out of data is possible without any trouble.

(2) When the column address n corresponds to a normal column and the column address n+1 corresponds to a spare column:

Such case is naturally limited to only one case wherein the column address n is 4(j−1)+3. In this case, the output signal $\overline{\text{CSPN}}$ of the fuse 81 presents a high level while the output signal $\overline{\text{CSPT}}$ of the fuse 82 presents a low level. Meanwhile, the signal CNTL presents a high level. Since the signal $\overline{\text{CSPN}}$ is at a high level, the potential at the signal line 806 presents a low level, and the corresponding column decoder CDj-1 is selected by the column address signal lines 700 so that data of 4 bits including data from the column address n are read out into the data output lines I/0.

On the other hand, data at the column address n+1 must be read out from a spare column in place of a faulty column. Since the signal CSPT presents a low level and the signal $\overline{\text{CNTL}}$ presents a high level, the signal NTAP of a low level and the signal STAP of a high level are outputted. Since the signal NTAP is at a low level, the signal TSLj-1 presents a low level in response to a signal from the column decoder CDj-1, and consequently, data are not read out from the faulty column 4j. Instead, since the signal STAP is at a high level, the spare column selecting line signal STSL presents a high level by way of the invertors INV11 and INV12, and consequently, data of the spare column S0 are read out into the data output line TI/0. After then, data from the column addresses n and n+1 are stored into the temporary register 90 in a similar manner as in the case (1) described above.

(3) When the column addresses n and n+1 both correspond to spare columns:

In this instance, the column address n ranges from 4j to 4j+2. The signal $\overline{\text{CSPN}}$ presents a low level: the signal $\overline{\text{CSPT}}$ presents a high level; and the signal CNTL presents a low level. Meanwhile, the signals NTAP and STAP both present a low level.

Since the signal $\overline{\text{CSPN}}$ presents a low level, the potential at the signal line 806 presents a high level, and consequently, the column selecting lines CSL from the column decoders CD always present a low level. Accordingly, data are not read out from any normal column. Instead, the signal CSPN is transferred to the spare column selecting line SCSL by way of the invertor INV13 so that it is transmitted as a high level signal to the spare columns S0 to S3. Consequently, data of 4 bits are read out from the spare columns into the data output lines I/0. Then, those of 2-bits from the column addresses n and n+1 among the 4-bit data thus read out are selected and amplified and then stored in the temporary register 90.

(4) When the column address n corresponds to a spare column and the column address n+1 corresponds to a normal column:

Such case is limited to only one case wherein the column address n is 4j+3. The signal $\overline{\text{CSPN}}$ presents a low level while the signal $\overline{\text{CSPT}}$ presents a high level. The signal CNTL presents a high level and the spare column selecting line SCSL presents a high level.

Since the signal $\overline{\text{CSPN}}$ is at a low level, the column selecting lines CSL present a low level, and consequently, data corresponding to the column address n are not read out from any normal column. Since the signal $\overline{\text{CSPN}}$ is at a low level, the spare column selecting line SCSL presents a high level, and data of 4 bits are read out from the spare columns into the data output lines I/0.

Then, data at the column address n+1 are read out from a normal column in the following manner. Since the signals CNTL and $\overline{\text{CSPT}}$ both present a high level, the signal NTAP presents a high level while the signal STAP presents a low level. Since the signal NTAP is at a high level, the level at the signal line 807 is a low level, and a column decoder CD is selected in accordance with the column address n. The level of the corresponding column selecting line TSL is caused to present a high level by the column decoder CD, and consequently, data at the normal column 4(j+1) are read out into the data output line TI/0.

As a result, of data of 5 bits from the spare columns S0 to S3 and the normal column 4(j+1), those of 2 bits from the column addresses n and n+1 are selected and amplified and then stored into the temporary register 90.

In this manner, when a faulty cell is present in an ordinary column and columns including such ordinary column are replaced by spare columns, four cases are available depending upon a column address n to be selected and a column address in which a faulty cell is present, but according to the present embodiment, in any of the cases, the semiconductor memory device can be accessed without any trouble.

Here, while the circuit includes the two fuses 81 and 82 each serving as a circuit into which a column address n at which a faulty cell is present is to be written, such circuit construction is based on the following reason. In the cases (1) and (3) among the four cases (1) to (4) described above, the column addresses n and n+1 do not correspond to a combination of a normal column and a spare column. Accordingly, in such case, only the fuse 81 may be provided to produce an output signal $\overline{\text{CSPN}}$. However, in the other cases (2) and (4), the column addresses n and n+1 correspond to a combination of a normal column and a spare column. Accordingly, it is necessary to distinguish which one of the column addresses n and n+1 corresponds to a normal column, and to this end, the fuse 82 must be provided additionally.

In other words, the fuse 81 for developing a signal $\overline{\text{CSPN}}$ which presents a low level only when the column address n selects a column decoder CDj for ordinary columns which includes a faulty column and the fuse 82 for developing a signal $\overline{\text{CSPT}}$ which presents a low level only when the column address n selects a column decoder CDj−1 at a preceding stage are provided. Consequently, in the case of (2) above, the signal $\overline{\text{CSPN}}$ presents a high level while the signal $\overline{\text{CSPT}}$ presents a low level, but in the case of (4), the signal $\overline{\text{CSPN}}$ presents a low level while the signal $\overline{\text{CSPT}}$ presents a high level, and accordingly, the two cases (2) and (4) can be distinguished from each other.

The embodiment described above is a mere example of the present invention and does not limit the present invention. For example, while the number of the data output lines I/0 is 4 so that 4-bit data may be inputted to the I/0 line selecting buffer 10, it is easy to make an expansion to 8 bits, 16 bits or the like, and the present invention can be applied similarly. Furthermore, the present invention can be applied also to a dual port memory of multi-bit construction wherein a plurality of data are accessed with a single column address.

What is claimed is:

1. A semiconductor memory device, comprising:
   a memory cell array including a plurality of memory cells arranged in a matrix;
   a redundant memory cell array including a plurality of spare cells each of which is to be used, when one of said memory cells is a faulty memory cell, in place of such faulty memory cell;
   a plurality of bit line pairs for interconnecting said memory cells in a direction of a column;
   a plurality of spare bit line pairs for
   said spare cells in a direction of a column;
   a column address information storage circuit having stored therein information of a column address of such faulty cell and a column address of a spare cell to be used in place of said faulty cell, said column address information storage circuit being connected to receive an input column address signal and operable in response to the input column address signal such that it selects, when said faulty cell does not belong to either of column addresses n and n+1, n being an integer equal to or greater than 0, a column decoder; when said faulty cell belongs to both of the column addresses n and n+1, it selects a spare column decoder; and when said faulty cell belongs to either one of the column addresses n and n+1, it selects a column decoder and a spare column decoder;
   a plurality of column decoders each for receiving and decoding, when selected by said column address information storage circuit, a column address signal to select a first or a second column selecting line;
   a first column selecting gate operable under the control of one of said first column selecting lines selected by said column decoders for connecting a corresponding one of said bit line pairs and a plurality of first data output line pairs to each other;
   a second column selecting gate operable under the control of one of said second column selecting lines selected by said column decoders for connecting an every m-1-th one of said bit line pairs and a second data output line pair to each other, m being an integer equal to or greater than 2;
   a spare column decoder for selecting, when selected by said column address information storage circuit, a third or a fourth column selecting line;
   a third column selecting gate operable under the control of said third column selecting line selected by said spare column decoder for connecting said spare bit line pairs and said first data output line pairs to each other;
   a fourth column selecting gate operable under the control of said fourth column selecting line selected by said spare column decoder for connecting said spare bit line pairs and said second data output line pair to each other;
   a first buffer for selecting, when data of m bits are received from said first data output line pairs, data from the column address n or the column addresses n and n+1 and amplifying and output the data;
   a second buffer for amplifying and outputting, when data of 1 bit are received from said second data output line pair, the data; and a register for receiving and storing therein data outputted from said first and/or second buffers; and wherein:

when the successive column addresses n and n+1 belong to one of said first column selecting lines and do not include any faulty cell, a corresponding one of said column decoders is selected by said column address information storage circuit so that data of m bits connected to said first column selecting line of the selected column decoder are transmitted by way of said first column selecting gate and said first data output line pairs to said first buffer, at which the data from said column addresses n and n+1 are selected and amplified and then stored into said register;

when the successive column addresses n and n+1 belong to two different ones of said first column selecting lines and do not include any faulty cells therein, two corresponding ones of said column decoders are selected by said column address information storage circuit so that data of m bits connected to one of the first column selecting lines to which the column address n belongs are transmitted by way of said first column selecting gate and said first data output line pairs to said first buffer, at which the data from said column address n are selected and amplified and then stored into said register, and data from said column address n+1 are transmitted by way of said second column selecting gate and said second data output line pair to said second buffer, at which the data are amplified and then stored into said register;

when the successive column addresses n and n+1 both belong to one of said first column selecting lines and include a faulty cell therein, said spare column decoder is selected by said column address information storage circuit so that data of m bits connected to said third column selecting line of said spare column decoder are transmitted by way of said third column selecting gate and said first data output line pairs to said first buffer, at which the data from said column addresses n and n+1 are selected and amplified and then stored into said register; and when the successive column addresses n and n+1 are connected to two different ones of said first column selecting lines and a faulty column does not belong to said column address n but belongs to said column address n+1, one of said column decoders corresponding to the first column selecting line connected to said column address n and said spare column decoder are selected by said column address information storage circuit so that data of m bits connected to one of said first column selecting lines to which said column address n belongs are transmitted by way of said first column selecting gate and said first data output line pairs to said first buffer, at which the data from said column address n are selected and amplified and then stored into said register, while data at said column address n+1 are transmitted by way of said fourth column selecting gate and said second data output line pair to said second buffer, at which the data are amplified and then stored into said register, when the successive column addresses n and n+1 belong to two different ones of said first column selecting lines and a faulty cell belongs to said column address n but does not belong to said column address n+1, said spare column decoder and one of said column decoders corresponding to the first column selecting line connected to said column address n+1 are selected by said column address information storage circuit so that data of m bits connected to said third column selecting line to which said column address n belongs are transmitted by way of said third column selecting gate and said first data output line pairs to said first buffer, at which the data from said column address n are selected and amplified and then stored into said register, while data from said column address n+1 are transmitted by way of said second column selecting gate and said second data output line pair to said second buffer, at which the data are amplified and then stored into said register.

2. A semiconductor memory device according to claim 1, wherein said column address information storage circuit includes a first storage circuit for developing, when a faulty cell belongs to any of the column addresses n to n+m−1, an output which varies only when one of said column addresses n to n+m−1 is received, and a second storage circuit for developing an output which varies only when any of the column addresses n-m to n-1 which are smaller by m from said column addresses n to n+m−1, respectively, is received.

3. A semiconductor memory device according to claim 1, wherein said column address information storage circuit includes a first storage circuit for developing, when a faulty cell belongs to any of the column addresses n to n+m−1, an output which varies only when one of said column addresses n to n+m−1 is received, an adder for outputting, when a column address is received, a value obtained by addition of m to the received column address, and a second storage circuit for developing an output which varies only when any of the column addresses n+m to n+2m−1 is received from said adder.

* * * * *